(12) United States Patent
Difulvio et al.

(10) Patent No.: US 8,854,784 B2
(45) Date of Patent: Oct. 7, 2014

(54) INTEGRATED FET AND REFLOWABLE THERMAL FUSE SWITCH DEVICE

(75) Inventors: Philippe Difulvio, Le Deluge (FR); James Toth, San Carlos, CA (US)

(73) Assignees: Tyco Electronics Corporation, Berwyn, PA (US); Tyco Electronics France SAS (FR)

( * ) Notice: Subject to any disclaimer, the term of this patent is extended or adjusted under 35 U.S.C. 154(b) by 0 days.

(21) Appl. No.: 13/284,779

(22) Filed: Oct. 28, 2011

(65) Prior Publication Data

US 2012/0281328 A1    Nov. 8, 2012

Related U.S. Application Data

(60) Provisional application No. 61/456,052, filed on Oct. 29, 2010.

(51) Int. Cl.
*H02H 5/04* (2006.01)
*H01L 23/62* (2006.01)

(52) U.S. Cl.
CPC .................................... *H01L 23/62* (2013.01)
USPC .......................................... 361/103; 361/104

(58) Field of Classification Search
USPC .................... 361/56, 93.8, 103, 104
See application file for complete search history.

(56) References Cited

U.S. PATENT DOCUMENTS

| | | |
|---|---|---|
| 2,386,094 A | 10/1945 | Duerkob |
| 2,613,297 A | 10/1952 | Laing |
| 2,790,049 A | 4/1957 | McAlister |
| 3,003,045 A | 10/1961 | Tichenor |
| 3,155,800 A | 11/1964 | Denton |
| 3,180,958 A | 4/1965 | Merill |
| 3,198,914 A | 8/1965 | Baran et al. |
| 3,629,766 A | 12/1971 | Gould |
| 3,761,856 A | 9/1973 | Mantelet |
| 3,840,834 A | 10/1974 | Obenhaus et al. |
| 4,030,061 A | 6/1977 | Gaskell et al. |
| 4,034,326 A | 7/1977 | Hill et al. |
| 4,058,784 A | 11/1977 | Gaia |
| 4,167,724 A | 9/1979 | McCaughna |
| 4,210,893 A | 7/1980 | Hora |
| 4,314,224 A | 2/1982 | Plasko |
| 4,352,082 A | 9/1982 | Barry et al. |
| 4,357,590 A | 11/1982 | Belhomme |

(Continued)

FOREIGN PATENT DOCUMENTS

DE          10125476 A1      7/2002
DE     10-2005-045778 A1     3/2007

(Continued)

OTHER PUBLICATIONS

International Search Report for International Application No. PCT/US2010/000863, mailed Jul. 20, 2010.

(Continued)

*Primary Examiner* — Danny Nguyen

(57) ABSTRACT

A circuit protection device includes a reflowable thermal fuse that shuts off current to a field-effect transistor if the field-effect transistor is overheating. In particular, the reflowable thermal fuse is integrated with the field-effect transistor to provide greater proximity between the field-effect transistor and the reflowable thermal fuse, thus providing efficient and accurate detection of an overtemperature condition in the field-effect transistor.

4 Claims, 4 Drawing Sheets

(56) References Cited

U.S. PATENT DOCUMENTS

| | | |
|---|---|---|
| 4,383,236 A | 5/1983 | Urani et al. |
| 4,445,079 A | 4/1984 | DeFilippis et al. |
| 4,451,814 A | 5/1984 | Barry et al. |
| 4,511,876 A | 4/1985 | Urani |
| 4,514,718 A | 4/1985 | Birx |
| 4,533,897 A | 8/1985 | Olson et al. |
| 4,593,262 A | 6/1986 | Krueger |
| 4,620,175 A | 10/1986 | Karr et al. |
| 4,631,626 A | 12/1986 | Bohan |
| 4,685,025 A | 8/1987 | Carlomagno |
| 4,727,347 A | 2/1988 | Cambio et al. |
| 4,727,348 A | 2/1988 | Okazaki |
| 4,808,960 A | 2/1989 | Nixon |
| 4,808,965 A | 2/1989 | Cenky |
| 4,888,573 A | 12/1989 | Dunn |
| 4,906,962 A | 3/1990 | Duimstra |
| 4,992,770 A | 2/1991 | Spalding et al. |
| 5,043,689 A | 8/1991 | Di Troia et al. |
| 5,153,555 A | 10/1992 | Enomoto et al. |
| 5,280,262 A | 1/1994 | Fischer |
| 5,726,623 A | 3/1998 | Camp |
| 5,781,394 A | 7/1998 | Lorenz et al. |
| 5,831,507 A | 11/1998 | Kasamatsu et al. |
| 5,886,613 A | 3/1999 | Magoon et al. |
| 5,945,903 A | 8/1999 | Reddy |
| 5,990,779 A | 11/1999 | Katsuki et al. |
| 6,236,550 B1 | 5/2001 | Mochida et al. |
| 6,256,183 B1 | 7/2001 | Mosesian |
| 6,300,860 B1 | 10/2001 | Hofsass |
| 6,304,166 B1 | 10/2001 | McLoughlin |
| 6,362,721 B1 | 3/2002 | Chen et al. |
| 6,396,381 B1 | 5/2002 | Takeda |
| 6,522,515 B1 * | 2/2003 | Whitney ............... 361/104 |
| 6,914,416 B2 | 7/2005 | Thomas et al. |
| 7,148,785 B2 | 12/2006 | Becker et al. |
| 7,345,570 B2 | 3/2008 | Kawanishi |
| 7,385,474 B2 | 6/2008 | Kawanishi |
| 7,477,130 B2 | 1/2009 | Fukushige et al. |
| 7,607,829 B2 | 10/2009 | Sumida et al. |
| 2002/0011918 A1 | 1/2002 | Miyazaki et al. |
| 2002/0089408 A1 | 7/2002 | Walsh et al. |
| 2002/0175801 A1 | 11/2002 | Katsuki et al. |
| 2004/0114286 A1 | 6/2004 | Sullivan et al. |
| 2004/0218329 A1 | 11/2004 | Becker et al. |
| 2006/0170528 A1 | 8/2006 | Fukushige et al. |
| 2006/0197647 A1 | 9/2006 | Whitney et al. |
| 2006/0268645 A1 * | 11/2006 | Graf et al. .................. 365/225.7 |
| 2006/0273876 A1 | 12/2006 | Pachla et al. |
| 2007/0002660 A1 * | 1/2007 | Hsieh .................. 365/225.7 |
| 2007/0020509 A1 | 1/2007 | Kim |
| 2008/0117015 A1 | 5/2008 | Leach |
| 2009/0102595 A1 | 4/2009 | Pachla et al. |
| 2010/0085141 A1 | 4/2010 | Knab et al. |
| 2010/0245022 A1 | 9/2010 | Galla et al. |
| 2010/0245027 A1 * | 9/2010 | Matthiesen et al. .......... 337/297 |

FOREIGN PATENT DOCUMENTS

| | | |
|---|---|---|
| EP | 0562438 A1 | 9/1993 |
| FR | 2863100 A1 | 6/2005 |
| FR | 2914108 A1 | 9/2008 |
| JP | 47-34674 | 11/1972 |
| JP | 09-73848 A | 3/1997 |
| JP | 09-306319 A | 11/1997 |
| JP | 2006-059568 A | 3/2006 |
| JP | 2007-149512 A | 6/2007 |
| JP | 2007-280758 A | 10/2007 |

OTHER PUBLICATIONS

International Search Report for International Application No. PCT/US2010/000874, mailed May 18, 2010.

* cited by examiner

INTEGRATED FET AND REFLOWABLE THERMAL FUSE SWITCH DEVICE

CROSS-REFERENCE TO RELATED APPLICATIONS

This application is an application under 35 USC 111(a) and claims priority under 35 USC 119 from Provisional Application Ser. No. 61/456,052, filed Oct. 29, 2010 under 35 USC 111(b). The disclosure of that provisional application is incorporated herein by reference.

BACKGROUND OF THE INVENTION

1. Field of the Invention

The present invention relates generally to electronic protection circuitry. More specifically, the present invention relates to a field-effect transistor embedded with an electrically activated surface mount thermal fuse.

2. Introduction to the Invention

Protection circuits are often utilized in electronic circuits to isolate failed circuits from other circuits. For example, the protection circuit may be utilized to prevent a cascade failure of circuit modules in an electronic automotive engine controller or on a computer motherboard. Protection circuits may also be utilized to guard against more serious problems, such as a fire caused by a transistor overheating or other power supply circuit failures.

One type of protection circuit is a thermal fuse. U.S. Publication No. 2010/0245027, published Sep. 30, 2010, and U.S. Publication No. 2010/0245022, published Sep. 30, 2010, each of which is incorporated herein by reference in its entirety, disclose improved thermal fuses that are resettable, or reflowable. The reflowable thermal fuse is configured to, for example, open a circuit if a field-effect transistor (FET) temperature reaches an overtemperature condition. The reflowable thermal fuse may be placed close enough to the FET to provide sufficient heat transfer. The reliability of the reflowable thermal fuse to detect an overheating FET and open the corresponding circuit is improved by an increased proximity to the FET, which ensures a more efficient heat transfer from the FET to the reflowable thermal fuse.

SUMMARY OF THE INVENTION

A circuit protection device includes a reflowable thermal fuse that shuts off current to a FET if the FET is overheating. In particular, the reflowable thermal fuse is integrated with the FET to provide greater proximity between the FET and the reflowable thermal fuse, thus providing efficient and accurate detection of an overtemperature condition in the FET.

DETAILED DESCRIPTION OF THE INVENTION

Figure 1:
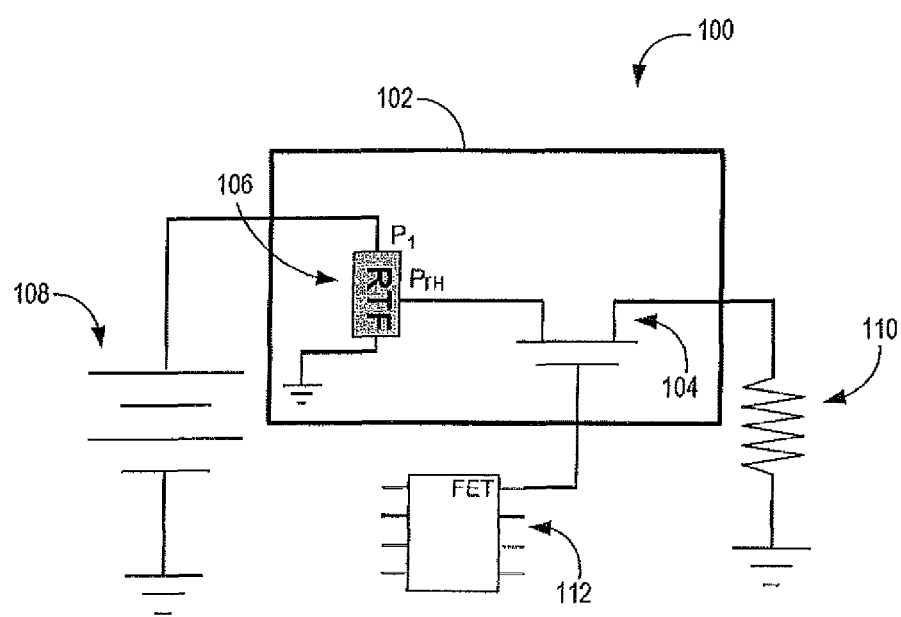
FIG. 1 shows an exemplary circuit including a circuit protection device.

FIG. 1 shows an exemplary circuit 100 including a circuit protection device 102 having an integrated FET 104 and reflowable thermal protection device, referred to herein as a reflowable thermal fuse (RTF) 106. The schematic includes a power supply 108, the circuit protection device 102, a load resistance 110 and a control IC 112. The circuit protection device includes a FET connected in series and integrated with a reflowable thermal fuse.

Figure 2:
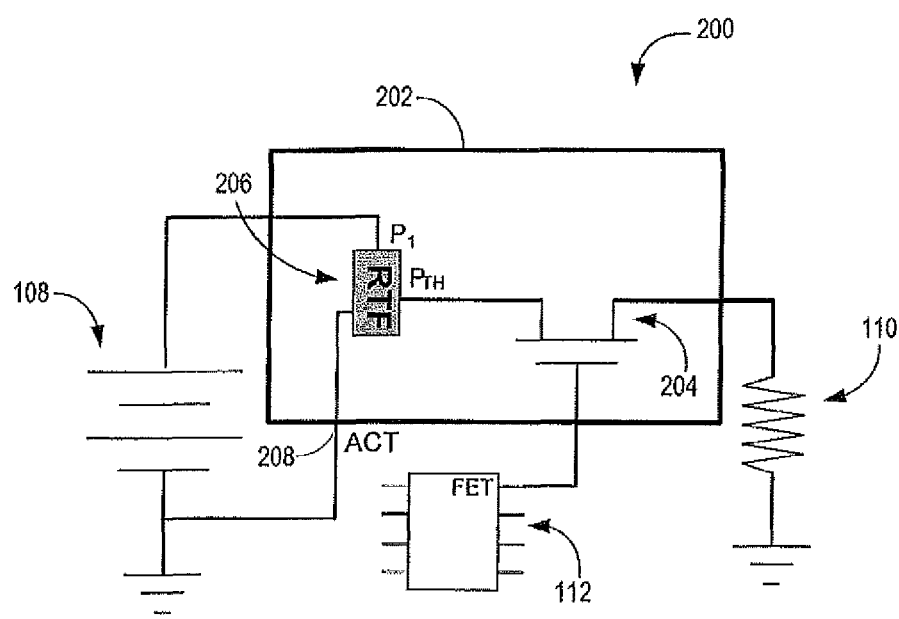
FIG. 2 shows a second exemplary circuit including a circuit protection device.

FIG. 2 shows a second exemplary circuit 200 including a circuit protection device 202 having an integrated FET 204 and reflowable thermal fuse 206. The circuit protection device 202 includes an activation pin 208 to which the reflowable thermal fuse 206 is connected. The activation pin 208 is in communication with ground. The circuit protection device 202 may be used, for example, for FETs in a high-side configuration.

Figure 3:
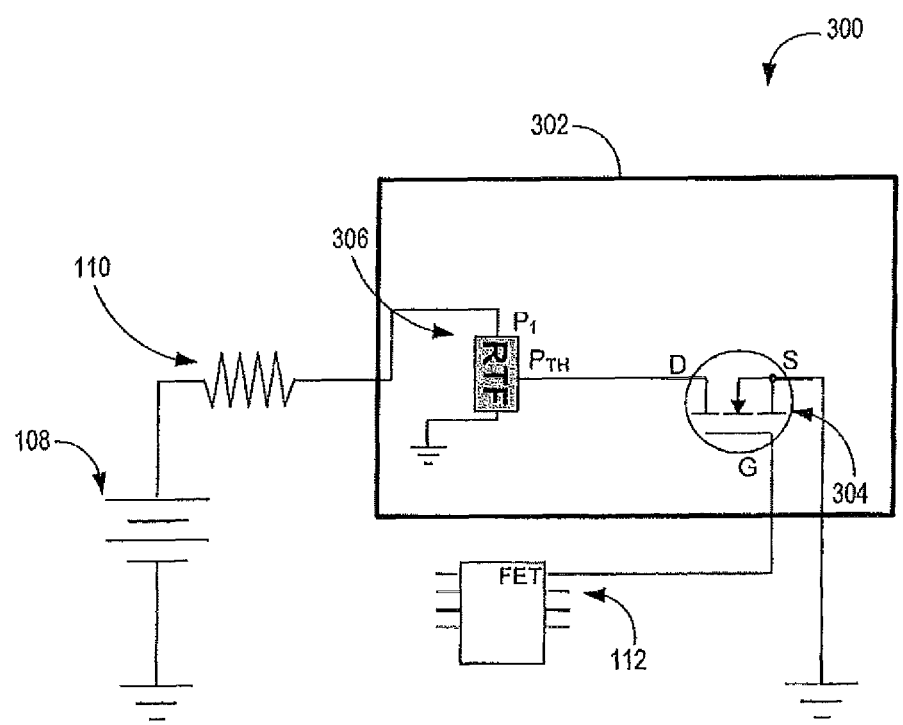
FIG. 3 shows a third exemplary circuit including a circuit protection device.

FIG. 3 shows a third exemplary circuit 300 including a circuit protection device 302 in which the FET 304 is an N-channel Power FET in a low-side configuration. In this example the reflowable thermal fuse 306 is in communication with the drain of the N-channel Power FET.

It will be appreciated that the reflowable thermal fuse 106, 206, 306 may also be integrated with FETs of the P-channel type. It will also be appreciated that the reflowable thermal fuse may be integrated with FETs in low and/or high side configurations. Further, it will be appreciated that the circuit protection device 102, 202, 302 may include multiple FETs integrated with and protected by the reflowable thermal fuse. While the circuits are shown and described in the context of an automotive control circuit, it will be understood that the circuit protection device may be used for circuit protection on computer motherboards or other electronics applications to protect against FET overheating.

The reflowable thermal fuse 106, 206, 306 is configured to open up when the FET achieves an overtemperature condition. Generally, the reflowable thermal fuse 106, 206, 306 includes a conduction element through which a load current flows, and an elastic element adapted to apply a force on the conduction element. In some embodiments, the conduction element incorporates a sensing element. When the temperature of the sensing element exceeds a threshold, the sensing element loses its resilience and becomes susceptible to deformation and/or breakage via the force on the conduction element applied by the elastic element. Eventually, the conduction element mechanically opens under the force, resulting in an open circuit condition. In other embodiments, the sensing element and the conduction element are separate and the sensing element acts to keep the conduction element in a low resistance state.

During a reflow process, the sensing element may lose its resilience. To prevent the force applied by the elastic element from opening the conduction element during installation, a restraining element may be utilized to maintain the elastic element in a state whereby the elastic element does not apply force on the conduction element. After the reflowable thermal fuse 106, 206, 306 is installed on a panel and/or embedded into the FET, and passed through a reflow oven, the restraining element may be blown by applying an activating current through the restraining element. This in turn activates the reflowable thermal fuse 106, 206, 306.

The reflowable thermal fuse is described in more detail in U.S. application Ser. Nos. 12/383,560 and 12/383,595, each of which is incorporated herein by reference in its entirety. As described herein, the reflowable thermal fuse is integrated with the FET to provide greater proximity between the FET and the reflowable thermal fuse, thus providing greater efficiency and accuracy in detecting the overtemperature condition of the FET.

In one embodiment, the FET may be embedded with the reflowable thermal fuse directly into a single package or component. For example, the reflowable thermal fuse may be embedded into the FET before molding a package around the FET. In this example the reflowable thermal fuse may be in intimate thermal contact with the FET. The embedded reflowable thermal fuse may then be reflowed on a board. The structure of the reflowable thermal fuses described in U.S. application Ser. Nos. 12/383,560 and 12/383,595, allows the reflowable thermal fuses to be embedded into the FET and reflowed on a board without the molding or reflow process opening up the thermal fuse.

Some components in the FET structure can be used as the components of reflowable thermal fuse, or vice versa. For example, the spring-bar of an exemplary reflowable thermal fuse, as described in U.S. application Ser. Nos. 12/383,560 and 12/383,595, may be used as a clip to attach to the source or drain of the FET in place of wire bonds. The reflowable thermal fuse may be embedded below the FET, or above the FET to account for rising heat. The reflowable thermal fuse may be embedded laterally relative to the FET on the FET PCB. The structure of the reflowable thermal fuse may be configured to provide a lower resistance than the FET's $R_{DS\,on}$.

Figure 4:
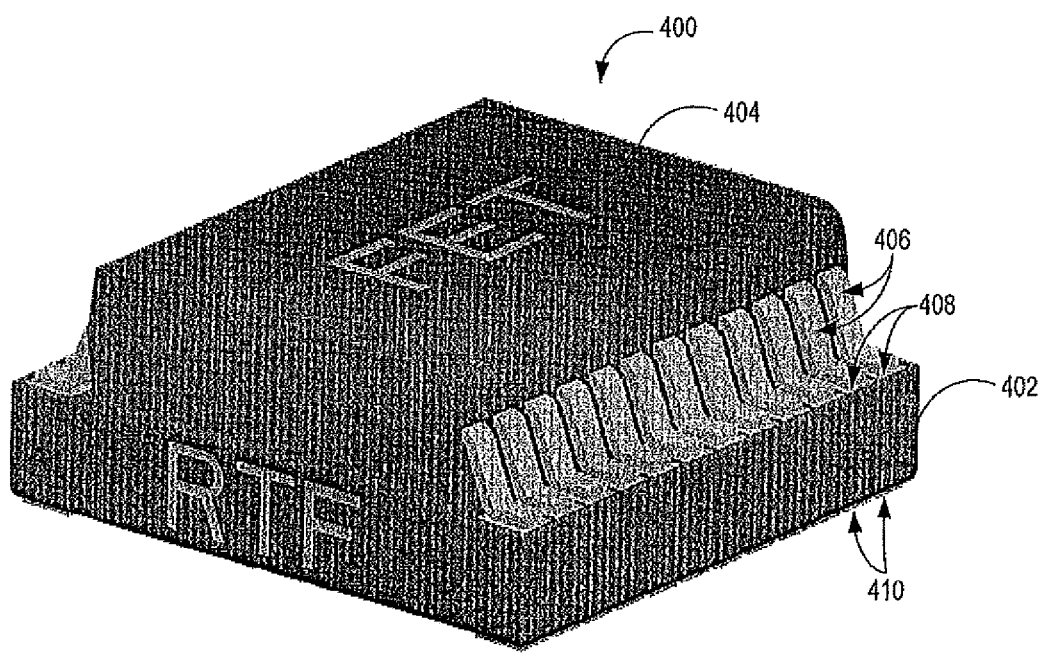
FIG. 4 shows an embodiment of the integrated circuit protection device.

FIG. 4 shows another embodiment of an integrated circuit protection device 400. In particular, FIG. 4 shows a reflowable thermal fuse package 402 linked to the heat sink of a separate FET package 404, which may include multiple FETs. The reflowable thermal fuse package 402 may also include multiple reflowable thermal fuses, or may include one reflowable thermal fuse protecting one or more FETs of the FET package 404. Leads 406 from the FET package 404 may connect with leads 408 on the reflowable thermal fuse package 402. The reflowable thermal fuse package 402 may further include leads 410 that connect to the circuit board. While FIG. 4 shows the FET package 404 above the reflowable thermal fuse package 402, it will be understood that a FET package may be connected below a reflowable thermal fuse package.

While the integrated circuit protection device has been described with reference to certain embodiments, it will be understood by those skilled in the art that various changes may be made and equivalents may be substituted without departing from the scope of the claims of the application. In addition, many modifications may be made to adapt a particular situation or material to the teachings without departing from its scope. Therefore, it is intended that the circuit protection device including integrated FET and reflowable thermal fuse are not to be limited to the particular embodiments disclosed, but to any embodiments that fall within the scope of the claims.

What is claimed is:

1. A circuit protection device comprising:
   a field-effect transistor; and
   a reflowable thermal fuse in communication with the field-effect transistor, the reflowable thermal fuse (i) being configured to cut off current flow to the field-effect transistor based on a temperature of the field-effect transistor, (ii) being embedded into the field-effect transistor, and (iii) being capable of being reflowed without opening up the reflowable thermal fuse.

2. The circuit protection device of claim 1, wherein the reflowable thermal fuse is in intimate thermal contact with the field-effect transistor.

3. The circuit protection device of claim 1, further comprising a device package enclosing the reflowable thermal fuse and the field-effect transistor.

4. The circuit protection device of claim 1, further comprising a second field-effect transistor in communication with the reflowable thermal fuse, wherein the reflowable thermal fuse is configured to cut off current flow to the second field-effect transistor based on a temperature of the second field-effect transistor.

* * * * *